(12) United States Patent
Kolcuoglu et al.

(10) Patent No.: US 10,778,206 B2
(45) Date of Patent: Sep. 15, 2020

(54) BIASING OF RADIO FREQUENCY SWITCHES FOR FAST SWITCHING

(71) Applicant: Analog Devices Global Unlimited Company, Hamilton (BM)

(72) Inventors: Turusan Kolcuoglu, Billerica, MA (US); Huseyin Kayahan, Istanbul (TR); Yusuf Alperen Atesal, Istanbul (TR)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/926,323

(22) Filed: Mar. 20, 2018

(65) Prior Publication Data

US 2019/0296726 A1 Sep. 26, 2019

(51) Int. Cl.
*H04B 1/44* (2006.01)
*H03K 17/04* (2006.01)
*H03K 17/693* (2006.01)

(52) U.S. Cl.
CPC ....... *H03K 17/0406* (2013.01); *H03K 17/693* (2013.01); *H04B 1/44* (2013.01)

(58) Field of Classification Search
CPC ............. H03K 17/0406; H03K 17/693; H03K 17/04106; H03K 17/0412; H04B 1/44
See application file for complete search history.

(56) References Cited

U.S. PATENT DOCUMENTS

| 5,355,036 A | 10/1994 | Gata |
| 5,541,600 A | 7/1996 | Blumenkrantz et al. |
| 5,798,959 A | 8/1998 | Onetti et al. |
| 6,642,578 B1 | 11/2003 | Arnold et al. |
| 7,123,884 B2 | 10/2006 | Nakakubo et al. |
| 7,579,634 B2 | 8/2009 | Onodera et al. |
| 7,613,442 B1 | 11/2009 | Kelly et al. |
| 8,547,157 B1 | 10/2013 | Mangold et al. |
| 8,649,741 B2 * | 2/2014 | Iijima ................ H03K 17/6221 333/103 |
| 8,710,899 B2 | 4/2014 | George |
| 8,963,618 B2 | 2/2015 | Keane et al. |
| 9,048,739 B2 | 6/2015 | Shoji et al. |
| 9,374,124 B2 | 6/2016 | Kolcuoglu et al. |
| 9,379,698 B2 | 6/2016 | Nohra |
| 9,548,722 B2 | 1/2017 | Atesal et al. |

(Continued)

FOREIGN PATENT DOCUMENTS

| CN | 103731119 A | 4/2014 |
| CN | 105487086 A | 4/2016 |

(Continued)

*Primary Examiner* — Jung Kim
(74) *Attorney, Agent, or Firm* — Knobbe, Martens, Olson & Bear, LLP

(57) ABSTRACT

Apparatus and methods for biasing radio frequency (RF) switches to achieve fast switching are disclosed herein. In certain configurations, a switch bias circuit generates a switch control voltage for turning on or off a switch that handles RF signals. The switch bias circuit provides the switch control voltage to a control input of the switch by way of a resistor. Additionally, the switch bias circuit pulses the switch control voltage when turning on or off the switch to thereby shorten switching time. Thus, the switch can be turned on or off quickly, which allows the switch to be available for use soon after the state of the switch has been changed.

34 Claims, 10 Drawing Sheets

(56) References Cited

U.S. PATENT DOCUMENTS

| | | | |
|---|---|---|---|
| 9,667,244 B1 | 5/2017 | Cavus et al. | |
| 9,667,255 B2 | 5/2017 | Englekirk | |
| 9,712,158 B1 | 7/2017 | Cavus et al. | |
| 2006/0128334 A1 | 6/2006 | Ikuta et al. | |
| 2007/0013432 A1* | 1/2007 | Miyazawa | H03K 17/005 327/404 |
| 2010/0066427 A1 | 3/2010 | George | |
| 2011/0260774 A1 | 10/2011 | Granger-Jones et al. | |
| 2014/0002214 A1 | 1/2014 | Bawell et al. | |
| 2015/0244051 A1 | 8/2015 | Domino | |
| 2015/0288359 A1 | 10/2015 | Bakalski et al. | |
| 2016/0248400 A1 | 8/2016 | Walker | |
| 2017/0272066 A1 | 9/2017 | Scott et al. | |

FOREIGN PATENT DOCUMENTS

| | | |
|---|---|---|
| EP | 0 753 940 A1 | 1/1997 |
| GB | 2 415 844 A | 1/2006 |
| JP | H05 95239 A | 4/1993 |
| JP | 2002/064974 A | 2/2002 |
| JP | 2002/064975 A | 2/2002 |
| WO | WO 2012/015849 A1 | 2/2012 |

* cited by examiner

BIASING OF RADIO FREQUENCY SWITCHES FOR FAST SWITCHING

FIELD OF THE DISCLOSURE

Embodiments of the invention relate to electronic systems, and more particularly, to biasing of radio frequency switches.

BACKGROUND

A radio frequency (RF) communication system can include RF switches used for a variety of purposes.

In one example, an RF communication system can include an antenna switch module (ASM) implemented using RF switches. Additionally, the antenna switch module can be used to electrically connect an antenna to a particular transmit or receive path of the system, thereby allowing multiple components to access the antenna. In another example, an RF communication system can include a digital step attenuator (DSA), and the DSA can include RF switches that are turned on or off to control an amount of attenuation provided by the DSA.

SUMMARY OF THE DISCLOSURE

Apparatus and methods for biasing radio frequency (RF) switches to achieve fast switching are disclosed herein. In certain configurations, a switch bias circuit generates a switch control voltage for turning on or off a switch that handles RF signals. The switch bias circuit provides the switch control voltage to a control input of the switch by way of a resistor. Additionally, the switch bias circuit pulses the switch control voltage when turning on or off the switch to thereby shorten switching time. Thus, the switch can be turned on or off quickly, which allows the switch to be available for use soon after the state of the switch has been changed.

In one aspect, an RF system with fast switching speed is provided. The RF system includes an RF switch including a control input that controls an impedance of the RF switch. The RF system further includes a switch bias circuit configured to receive a control signal for selectively activating the RF switch, the switch bias circuit including an output configured to provide a switch control voltage. The RF system further includes a resistor electrically connected between the output of the switch bias circuit and the control input to the RF switch. The switch bias circuit is configured to pulse the switch control voltage in response to a transition of the control signal to thereby shorten a delay in switching the RF switch.

In another aspect, a method of switch control to provide fast switching speed is provided. The method includes controlling an impedance of an RF switch using a switch control voltage, receiving a control signal indicating whether to turn on or turn off the RF switch, and generating a pulse of the switch control voltage in response to a transition of the control signal to thereby shorten a delay in switching the RF switch.

In another aspect, an RF switching circuit is provided. The RF switching circuit includes a FET switch including a gate, a switch bias circuit configured to receive a control signal and to output a switch control voltage, and a resistor configured to provide the switch control voltage to the gate of the FET switch. The switch bias circuit is configured to generate a turn-on pulse of the switch control voltage in response to a transition of the control signal from an off state to an on state, and to generate a turn-off pulse of the switch control voltage in response to a transition of the control signal from the on state to the off state.

DETAILED DESCRIPTION OF EMBODIMENTS

Figure 1:
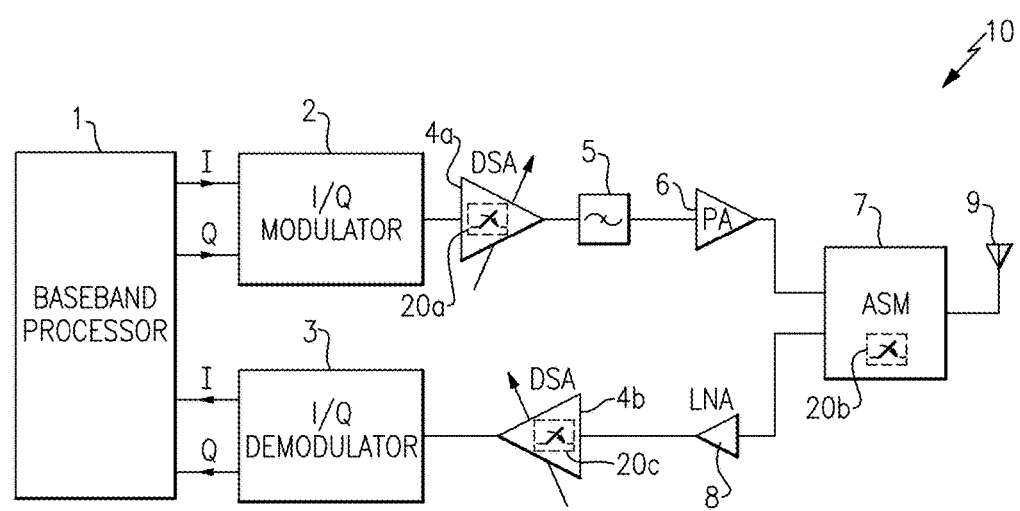
FIG. 1 is a schematic diagram of one example of a radio frequency (RF) system that can include one or more RF switching circuits in accordance with the teachings herein.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. Such RF communication systems can include one or more RF switches to provide control over routing of RF signals, connectivity between components or circuits, and/or to provide various other switching functions. Examples of RF communication systems with one or more RF switches include, but are not limited to, base stations, mobile devices (for instance, smartphones or handsets), laptop computers, tablets, Internet of Things (IoT) devices, and/or wearable electronics.

Certain RF switching circuits include a field-effect transistor (FET) switch and a switch bias circuit that controls a gate voltage of the switch to thereby change a channel impedance of the switch and modulate the switch's conductivity. For example, the switch bias circuit can control the gate voltage to a first level to turn off the FET switch such that the channel impedance is high and the RF signal does not pass through the FET switch. Additionally, the switch bias circuit can control the gate voltage to a second level to turn on the FET switch such that the channel impedance is low and the RF signal passes through the FET switch. Thus, the switch bias circuit is used to turn the FET switch on or off to control passage of the RF signal.

An RF signal can couple onto the gate of the FET switch via a parasitic gate-to-drain capacitance (Cgd) and/or a parasitic gate-to-source capacitance (Cgs) of the FET switch. To provide isolation, a gate resistor can be included between an output of the switch bias circuit and the gate of the FET switch.

Several benefits are provided by a large resistance value of the gate resistor, such as low loss and/or low cutoff frequency to provide wideband operation. However, making the resistance value of the gate resistor large also undesirably lengthens the turn-on time and turn-off time of the FET switch. For example, when the switch bias circuit changes the gate voltage of the FET switch, there is an undesirable switching delay based on a resistor-capacitor (RC) time constant arising from a resistance of the gate resistor and a gate capacitance of the FET switch. The delay in switching leads to an increase in turn-on time and turn-off time of the switch.

Thus, although implementing the gate resistor with a high resistance provides a number of benefits, it also degrades the switching performance of the FET switch.

Apparatus and methods for biasing RF switches to achieve fast switching are disclosed herein. In certain configurations, an RF system includes an RF switch including a control input that controls an impedance of the RF switch, a switch bias circuit configured to receive a control signal for selectively activating the RF switch, and a resistor electrically connected between an output of the switch bias circuit and the control input to the RF switch. The switch bias circuit generates a switch control voltage at the output, and pulses the switch control voltage in response to a transition of the control signal to thereby shorten a delay in switching the RF switch.

Thus, rather than directly transitioning the switch control voltage from an ON voltage to an OFF voltage, or vice versa, the switch control voltage is pulsed before being controlled to a steady-state voltage level. By pulsing the switch control voltage in this manner, charging or discharging at the control input of RF switch occurs faster, which shortens the switching delay of the RF switch.

In certain implementations, the switch bias circuit controls the RF switch not only with a steady-state switch ON voltage (for instance, a power high supply voltage) and a steady-state switch OFF voltage (for instance, a power low supply voltage or ground voltage), but also with a high voltage greater than the steady-state switch ON voltage and a low voltage lower than the steady-state switch OFF voltage.

For example, when turning on an n-type field-effect transistor (NFET) switch, the switch bias circuit uses the high voltage to control the gate voltage of the NFET switch for a portion of time, and thereafter controls the gate voltage with the steady-state switch ON voltage. Additionally, when turning off the NFET switch, the switch bias circuit uses the low voltage to control the gate voltage of the NFET switch for a portion of time, and thereafter controls the gate voltage with the steady-state switch OFF voltage. The result is a speed-up of the turn-on and turn-off times of the NFET switch.

In certain implementations, the duration of the pulse is controlled open-loop, for instance, based on a delay of a timer. In other implementations, the pulse duration is controlled closed-loop. For example, the switch bias circuit can include a replica or copy of the switch, and monitor the control input (for instance, a gate of a FET switch or a gate-to-source voltage of the FET switch) of the replica or copy switch to determine when to end the pulse and apply the steady-state voltage level of the switch control voltage.

In certain implementations, the voltage level of the pulse is beyond a breakdown voltage at which the switch can reliably operate, for example, in excess of a maximum gate-to-source voltage for FET switches. Thus, the pulse voltage level would damage the switch due to reliability considerations if used to control the switch in the steady-state. However, by applying the pulse via the resistor, the voltage directly at the control input of the switch remains within a voltage range for reliable operation. Thus, the benefits of fast switching time are achieved without damaging the switch.

Pulsing the switch control voltage provides an enhancement to switching speed with little to no impact on other performance characteristics of the RF switch, such as linearity, power handling capability, and/or insertion loss. For example, the switch control voltage can be pulsed without needing to include additional circuitry along the RF signal path through the switch or at the control input of the RF switch. Thus, the switching speed is improved without needing to add circuitry such as resistor bypass switches that could degrade performance by parasitically loading the RF switch.

FIG. 1 is a schematic diagram of one example of an RF communication system 10 that can include one or more RF switching circuits in accordance with the teachings herein.

Although, the RF communication system 10 illustrates one example of an electronic system that can include one or more RF switching circuits as described herein, RF switching circuits can be used in other configurations of electronic systems.

Furthermore, although a particular configuration of components is illustrated in FIG. 1, the RF communication system 10 can be adapted and modified in a wide variety of ways. For example, the RF communication system 10 can include more or fewer receive paths and/or transmit paths. Additionally, the RF communication system 10 can be modified to include more or fewer components and/or a different arrangement of components, including, for example, a different arrangement of RF switching circuits.

In the illustrated configuration, the RF communication system 10 includes a baseband processor 1, an I/Q modulator 2, an I/Q demodulator 3, a first digital step attenuator 4a, a second digital step attenuator 4b, a filter 5, a power amplifier 6, an antenna switch module 7, a low noise amplifier 8, and an antenna 9.

As shown in FIG. 1, baseband processor 1 generates an in-phase (I) transit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs configured to convert the I and Q transmit signals into an analog format, mixers for upconverting the I and Q transit signals to radio frequency, and a signal combiner for combining the upconverted I and Q signals into the modulated RF signal.

The first digital step attenuator 4a receives the modulated RF signal, and attenuates the modulated RF signal to generate an attenuated RF signal. The first digital step attenuator 4a can aid in obtaining a desired gain and/or power level associated with transmission. In the illustrated configuration, the first digital step attenuator 4a includes a first RF switching circuit 20a. The first digital step attenuator 4a illustrates one example of a circuit that can include one or more RF switching circuits in accordance with the teachings herein. For example, the first digital step attenuator 4a can include a cascade of attenuator stages, each of which can be bypassed using an RF switching circuit to aid in providing a digitally adjustable amount of attenuation.

The filter 5 receives the attenuated RF signal from the first digital step attenuator 4a, and provides a filtered RF signal to an input of the power amplifier 6. In certain configurations, the filter 5 can be a band pass filter configured to provide band filtering. However, the filter 5 can be a low pass filter, a band pass filter, a notch filter, a high pass filter, or a combination thereof, depending on the application.

The power amplifier 6 can amplify the filtered RF signal to generate an amplified RF signal, which is provided to the antenna switch module 7. The antenna switch module 7 is further electrically connected to the antenna 9 and to an input of the low noise amplifier 8. The antenna switch module 7 can be used to selectively connect the antenna 9 to the output of the power amplifier 6 or to the input of the low noise amplifier 8. In certain implementations, the antenna switch module 7 can provide a number of other functionalities, including, but not limited to, band switching and/or switching between different power modes.

In the illustrated configuration, the antenna switch module 7 includes a second RF switching circuit 20b. The antenna switch module 7 illustrates another example of a circuit that can include one or more RF switching circuits in accordance with the teachings here. For example, the antenna switch module 7 can include an RF switching circuit implemented as a single pole multi-throw switch. Although FIG. 1 illustrates a configuration in which the antenna switch module 7 operates as a single pole double throw switch, the antenna switch module 7 can be adapted to include additional poles and/or throws.

The LNA 8 receives an antenna receive signal from the antenna switch module 7, and generates an amplified antenna receive signal that is provided to the second digital step attenuator 4b. The second digital step attenuator 4b can attenuate the amplified antenna receive signal by a digitally-controllable amount of attenuation. As shown in FIG. 1, the second digital step attenuator 4b generates an attenuated receive signal, which is provided to the I/Q demodulator 3. Including the second digital step attenuator 4b can aid in providing the I/Q demodulator 3 with a signal that has a desired amplitude and/or power level. In the illustrated configuration, the second digital step attenuator 4b includes a third RF switching circuit 20c. The second digital step attenuator 4b illustrates another example of a circuit that can include one or more RF switching circuits in accordance with the teachings herein.

The I/Q demodulator 3 can be used to generate the I receive signal and the Q receive signal, as was descried earlier. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

The RF switching circuits 20a-20c can be used for handling RF signals using a variety of communication standards, including, for example, Global System for Mobile Communications (GSM), Code Division Multiple Access (CDMA), wideband CDMA (W-CDMA), Long Term Evolution (LTE), Enhanced Data Rates for GSM Evolution (EDGE), 3G, 4G, and/or 5G, as well as other proprietary and non-proprietary communications standards.

Moreover, the RF switching circuits 20a-20c can control switching of signals of a variety of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Providing an RF switch in a transmit or receive path of an RF communication system can impact the system's performance. For example, not only can the RF switch's linearity, power handling capability, and insertion loss impact operations of the system, but also transient performance characteristics such as turn-on time, turn-off time, and/or settling time can provide a performance impact. The teachings herein can be used improve transient performance characteristics of an RF switch, with little to no impact on other performance characteristics of the RF switch, such as linearity, power handling capability, and/or insertion loss.

Figure 2A:
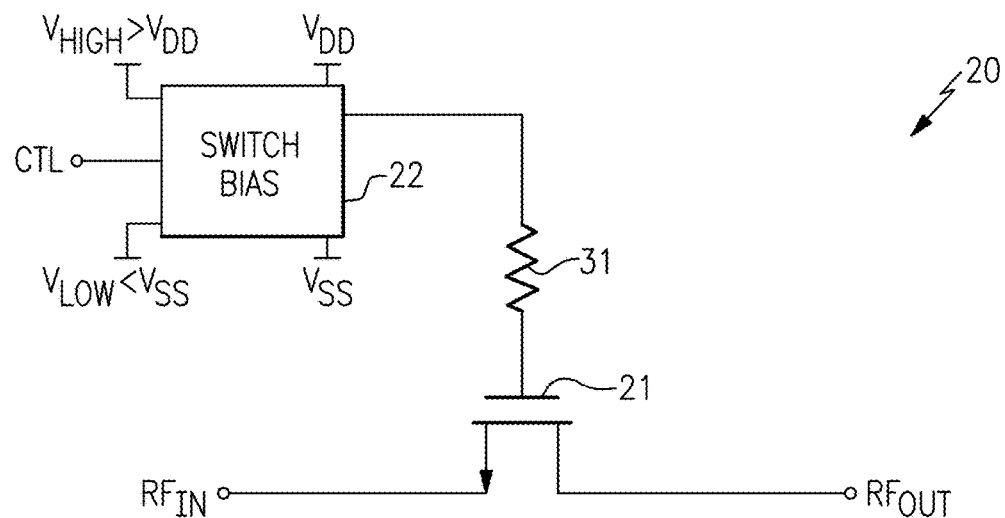
FIG. 2A is a circuit diagram of an RF switching circuit according to one embodiment.

FIG. 2A is a circuit diagram of an RF switching circuit 20 according to one embodiment. The RF switching circuit 20 includes an n-type field effect transistor (NFET) switch 21, a switch bias circuit 22, and a gate bias resistor 31.

As shown in FIG. 2A, the switch bias circuit 22 receives a control signal CTL for indicating whether the NFET switch 21 should be turned on or turned off by the switch bias circuit 22. Thus, the control signal CTL is used to selectively activate the NFET switch 21. The switch bias circuit 22 also receives a power high supply voltage $V_{DD}$, a ground or power low supply voltage $V_{SS}$, a high voltage $V_{HIGH}$ greater than the power high supply voltage $V_{DD}$, and a low voltage $V_{LOW}$ lower than the power low supply voltage $V_{SS}$.

Although FIG. 2A illustrates a configuration in which the switch bias circuit 22 is used to control one FET switch, the switch bias circuit 22 can be configured to bias one or more additional FET switches. In such configurations, the switch bias circuit 22 can include additional switch control inputs, such as a control signal associated with each FET switch. However, other configurations are possible, such as implementations in which a control signal is used to control multiple FET switches. For example, in certain implementations, a switch bias circuit is used to control a series FET switch as well as a shunt FET switch. Additionally, the series FET switch and the shunt FET switch can controlled by a common control signal such that when the series FET switch is turned on the shunt FET switch is turned off, and vice versa.

In the illustrated configuration, a source of the NFET switch 21 is electrically connected to the RF input $RF_{IN}$, and a drain of the NFET switch 21 is electrically connected to the RF output $RF_{OUT}$. Although an example in which an RF switch is connected between an RF input terminal and an RF output terminal, other configurations are possible, such as implementations in which the RF switch is connected between a first RF terminal and a second RF terminal that are bidirectional.

As shown in FIG. 2A, the gate bias resistor 31 is electrically connected between a gate bias output of the switch bias circuit 22 and a gate of the NFET switch 21. The gate bias resistor 31 can enhance isolation between the gate bias output of the switch bias circuit 22 and the gate of the NFET switch 21. For example, high frequency signal components can be coupled onto the gate of the NFET switch 21 via parasitic gain-to-drain and/or gate-to-source capacitances, and the gate bias resistor 31 can provide resistance that impedes the high frequency signal components from reaching the gate bias output of the switch bias circuit 22.

Although FIG. 2A illustrates the output of the switch bias circuit 22 being connected to the gate of the NFET switch 21 via the resistor 31, any suitable impedance can be connected between the output of the switch bias circuit 22 and the gate of the NFET switch 21. For example, in another embodiment, an inductor or a combination of an inductor and a resistor are connected between the output of a switch bias circuit and a control input to an RF switch.

The NFET switch 21 can be implemented in a variety of ways. In one embodiment, the NFET switch 21 is implemented as a silicon-on-insulator (SOI) metal oxide semiconductor (MOS) transistor including a body that is electrically floating. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

Although FIG. 2A illustrates a configuration using n-type transistors, the teachings herein are applicable to configurations using p-type transistors or a combination of n-type and p-type transistors. Furthermore, the teachings herein are applicable to other types of RF switches that include a control input for controlling the RF switch's impedance.

The RF switching circuit 20 can be used in a wide variety of configurations within an electronic system. For example, the NFET switch 21 can operate in a transmit signal path or a receive signal path of an RF communication system, such as the RF communication system 10 of FIG. 1.

With continuing reference to FIG. 2A, the switch bias circuit 22 receives the control signal CTL for selectively activating the NFET switch 21. In particular, the control signal CTL indicates whether the switch bias circuit 22 should turn on the NFET switch 21 or turn off the NFET switch 21.

The switch bias circuit 22 generates a switch control voltage at the gate bias output, and pulses the switch control voltage in response to a transition of the control signal CTL to thereby shorten a delay in switching the NFET switch 21.

Thus, rather than directly transitioning the switch control voltage from an ON voltage to an OFF voltage, or vice versa, the switch control voltage is temporarily pulsed before being controlled to a steady-state voltage level. By pulsing the switch control voltage in this manner, the switching delay of the NFET switch 21 is shortened.

The pulsing can be applied when turning on the NFET switch 21 to improve turn-on speed and/or when turning off the NFET switch 21 to improve turn-off speed. Although various embodiments herein provide a pulse for both an ON to OFF transition and for an OFF to ON transition, the teachings herein are also applicable to implementations in which a pulse is only provided for an ON to OFF transition or only provided for an OFF to ON transition.

In certain implementations, when switching the NFET switch 21 from an OFF state to an ON state, the switch bias circuit 22 first changes the switch control voltage from a steady-state switch OFF voltage (for instance, $V_{SS}$) to the high voltage $V_{HIGH}$, and then from the high voltage $V_{HIGH}$ to a steady-state switch ON voltage (for instance, $V_{DD}$). Thus, the switch bias circuit 22 pulses the switch control voltage when turning on the NFET switch 21.

By pulsing the switch control voltage in this manner, the turn-on time of the NFET switch 21 is shortened. The switch bias circuit 22 can control a duration of the pulse in a variety of ways, including open-loop control (for instance, based on a delay of a timer) or closed-loop control (for instance, by monitoring the gate voltage of a replica or copy of the NFET switch 21).

In certain implementations, when switching the NFET switch 21 from an ON state to an OFF state, the switch bias circuit 22 first changes the switch control voltage from a steady-state switch ON voltage (for instance, $V_{DD}$) to the low voltage $V_{LOW}$, and then from the low voltage $V_{LOW}$ to a steady-state switch OFF voltage (for instance, $V_{SS}$). Thus, the switch bias circuit 22 pulses the switch control voltage when turning off the NFET switch 21 to thereby shorten turn-off time. The duration of the pulse can be controlled in a wide variety of ways, including open-loop control or closed-loop control. In certain implementations a shared delay control circuit is used for controlling a duration of turn-on and turn-off pulses. In other implementations, separate delay control circuits are used for controlling a duration of turn-on and turn-off pulses.

The high voltage $V_{HIGH}$ and/or the low voltage $V_{LOW}$ can be generated in a wide variety of ways, including, but not limited to, using charge pumps or other voltage regulators. In certain implementations, at least one of the high voltage $V_{HIGH}$ or the low voltage $V_{LOW}$ is beyond a breakdown voltage for transistor reliability considerations, for example, beyond a maximum or minimum gate-to-source voltage permitted by the processing technology used to fabricate the NFET switch 21. Thus, controlling the gate of the NFET switch 21 with the high voltage $V_{HIGH}$ and/or the low voltage $V_{LOW}$ in the steady state would potentially damage the RF switch 21 due to transistor reliability limitations.

However, by applying the pulsed switch control voltage to an opposite end of the gate resistor 31 as the end connected to the gate of the NFET switch 21, the voltage directly at the gate remains within a range of voltages acceptable for reliable operation of the NFET switch 21. Thus, the benefits of fast switching time are achieved while operating within voltage constraints or limitations of the NFET switch 21.

Figure 2B:
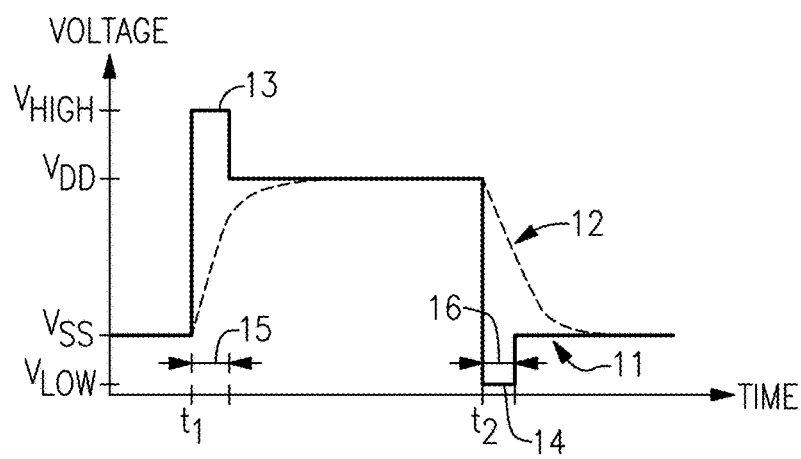
FIG. 2B is one example of a timing diagram for the RF switching circuit of FIG. 2A.

FIG. 2B is one example of a timing diagram for the RF switching circuit 20 of FIG. 2A. The timing diagram includes a first plot 11 of switch control voltage outputted by the switch bias circuit 22 versus time, and a second plot 12 of gate voltage of the NFET switch 21 versus time. The timing diagram includes a first time $t_1$ at which the control signal CTL transitions to turn the NFET switch 21 from an OFF state to an ON state, and a second time $t_2$ at which the control signal CTL transitions to turn the NFET switch 21 from the ON state to the OFF state.

As shown in FIG. 2B, the switch bias circuit 22 pulses the switch control voltage when turning on the switch as well as when turning off the switch, in this embodiment. For example, when the NFET switch 21 is turned on at time $t_1$, the switch bias circuit 22 generates a turn-on pulse 13 associated with first transitioning the switch control voltage from $V_{SS}$ to $V_{HIGH}$, and thereafter from $V_{HIGH}$ to $V_{DD}$. Additionally, when the NFET switch 21 is turned off at time $t_2$, the switch bias circuit 22 generates a turn-off pulse 14 associated with first transitioning the switch control voltage from $V_{DD}$ to $V_{LOW}$, and thereafter from $V_{LOW}$ to $V_{SS}$.

The duration 15 of the turn-on pulse 13 and the duration 16 of the turn-off pulse 14 can be controlled in a wide variety of ways. In a first example, the switch bias circuit 22 includes a timer for controlling a width of the pulses. In a second example, the switch bias circuit 22 includes a replica or copy of the NFET switch 21, and monitors a gate voltage of the replica or copy switch to dynamically control pulse width. In a third example, the switch bias circuit 22 includes a replica or copy of the NFET switch 21, and monitors a gate-to-source voltage difference of the replica or copy switch to dynamically control pulse width.

As shown in FIG. 2B, the turn-on pulse 13 and the turn-off pulse 14 have opposite polarity. For example, the turn-on pulse 13 has increased voltage level before settling to a lower voltage level, while the turn-off pulse 14 has decreased voltage level before settling to a higher voltage level. In certain implementations, a switch bias circuit generates a first pulse in response to an ON to OFF transition of an RF switch, and generates a second pulse in response to an OFF to ON transition of the RF switch, and the first and second pulse have opposite polarity.

Figure 3A:
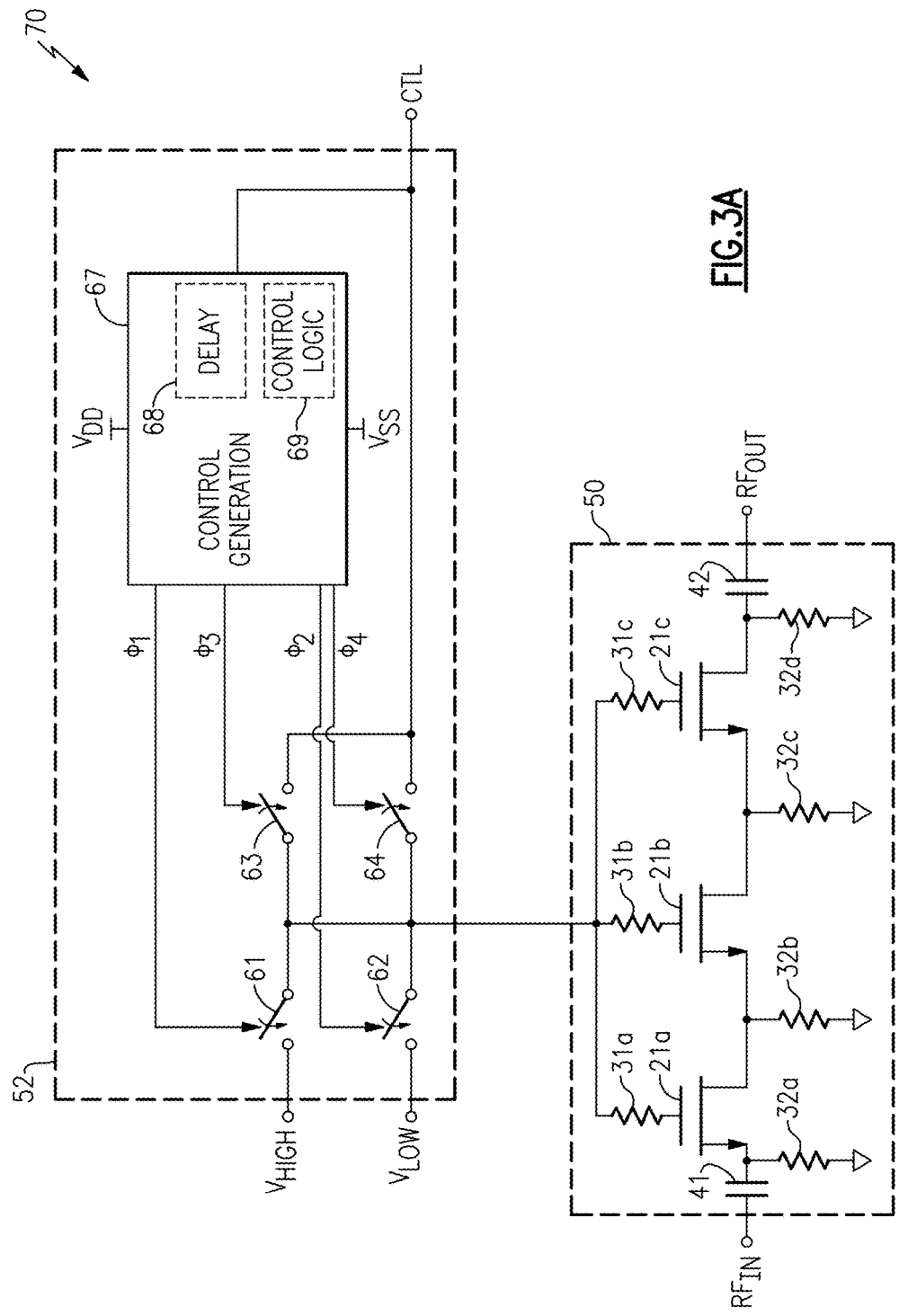
FIG. 3A is a circuit diagram of an RF switching circuit according to another embodiment.

FIG. 3A is a circuit diagram of an RF switching circuit 70 according to another embodiment. The RF switching circuit 70 includes an RF switch 50 and a switch bias circuit 52. Although one embodiment of an RF switching circuit is shown in FIG. 3A, the teachings herein are applicable to RF switching circuits implemented in a wide variety of ways.

The RF switch 50 includes a first NFET switch 21a, a second NFET switch 21b, a third NFET switch 21c, a first gate bias resistor 31a, a second gate bias resistor 31b, a third gate bias resistor 31c, a first channel biasing resistor 32a, a second channel biasing resistor 32b, a third channel biasing resistor 32c, a fourth channel biasing resistor 32d, a first DC blocking capacitor 41, and a second DC blocking capacitor 42. Although one embodiment of an RF switch is shown in FIG. 3A, the teachings herein are applicable to RF switches implemented in a wide variety of ways.

In the illustrated embodiment, the first NFET switch 21a, the second NFET switch 21b, and the third NFET switch 21c are in series with one another. Including multiple FET switch components in series can increase a power handling capability of an RF switch. Although an example with three FET switches in series is shown, more or fewer FET switches can be included to achieve desired performance characteristics. As shown in FIG. 3A, the gate bias resistors 31a-31c are electrically connected between the gate bias output of the switch bias circuit 52 and the gates of the NFET switches 21a-21c, respectively. The switch bias circuit 52 can also be used separately to bias each of the NFET switches 21a-21c as well according to application specifications.

The channel biasing resistors 32a-32d collectively operate to control a bias voltage of the sources and drains of the NFET switches 21a-21c, thereby helping to control gate-to-source and gate-to-drain biasing characteristics of the transistors. Although one example of channel biasing is shown, other implementations of channel biasing are possible, including, but not limited to, implementations using resistors in parallel with the channels of one or more NFET switches.

The first DC blocking capacitor 41 and second DC blocking capacitor 42 provide DC blocking to allow the sources and drains of the NFET switches 21a-21c to operate at a different DC voltage levels than the RF input $RF_{IN}$ and the RF output $RF_{OUT}$. However, the teachings herein are also applicable to RF switches that operate without DC blocking capacitors.

The switch bias circuit 52 includes a first control switch 61, a second control switch 62, a third control switch 63, a fourth control switch 64, and a control generation circuit 67. Although one embodiment of a switch bias circuit 52 is shown, the teachings herein are applicable to switch bias circuits implemented in a wide variety of ways.

As shown in FIG. 3A, the control generation circuit 67 generates a first bias control signal $\varphi_1$ for selectively turning on the first control switch 61 to thereby control the output of the switch bias circuit 52 with the high voltage $V_{HIGH}$. The control generation circuit 67 further generates a second bias control signal $\varphi_2$ for selectively turning on the second control switch 62 to thereby control the output of the switch bias circuit 52 with the low voltage $V_{LOW}$. The control generation circuit 67 further generates a third bias control signal $\varphi_3$ for selectively turning on the third control switch 63 to thereby control the output of the switch bias circuit 52 with the control signal CTL. The control generation circuit 67 further generates a fourth bias control signal $\varphi_4$ for selectively turning on the fourth control switch 64 to thereby control the output of the switch bias circuit 52 with the control signal CTL. The bias control signals can have any suitable voltage levels, for instance, voltage levels selected based on process device reliability limits.

The control generation circuit 67 includes a delay circuit 68 for controlling a duration of pulses when turning on or off the RF switch 50, and control logic 69 for selectively activating the bias control signals $\varphi_1$-$\varphi_4$ to turn on the control switches 61-64, respectively.

In the illustrated embodiment, in response to a transition of the control signal CTL from an off value (for instance, $V_{SS}$) to an on value (for instance, $V_{DD}$), the control logic 69 initially activates the first control switch 61 (while keeping the control switches 62-64 off), thereby controlling the output of the switch bias circuit 52 to the high voltage $V_{HIGH}$. After a time duration controlled by the delay circuit 68, the control logic 69 turns off the first control switch 61 and turns on the third control switch 63 (while keeping control switches 62 and 64 off), thereby controlling the output of the switch bias circuit 52 to the on value of the control signal CTL, which can be $V_{DD}$ in certain implementations.

Additionally, in response to a transition of the control signal CTL from the on value to the off value, the control logic 69 initially activates the second control switch 62 (while keeping the control switches 61, 63, and 64 off), thereby controlling the output of the switch bias circuit 52 to the low voltage $V_{LOW}$. After a time duration controlled by the delay circuit 68, the control logic 69 turns off the second control switch 62 and turns on the fourth control switch 64 (while keeping control switches 61 and 63 off), thereby controlling the output of the switch bias circuit 52 to the off value of the control signal CTL, which can be $V_{SS}$ in certain implementations.

Figure 3B:
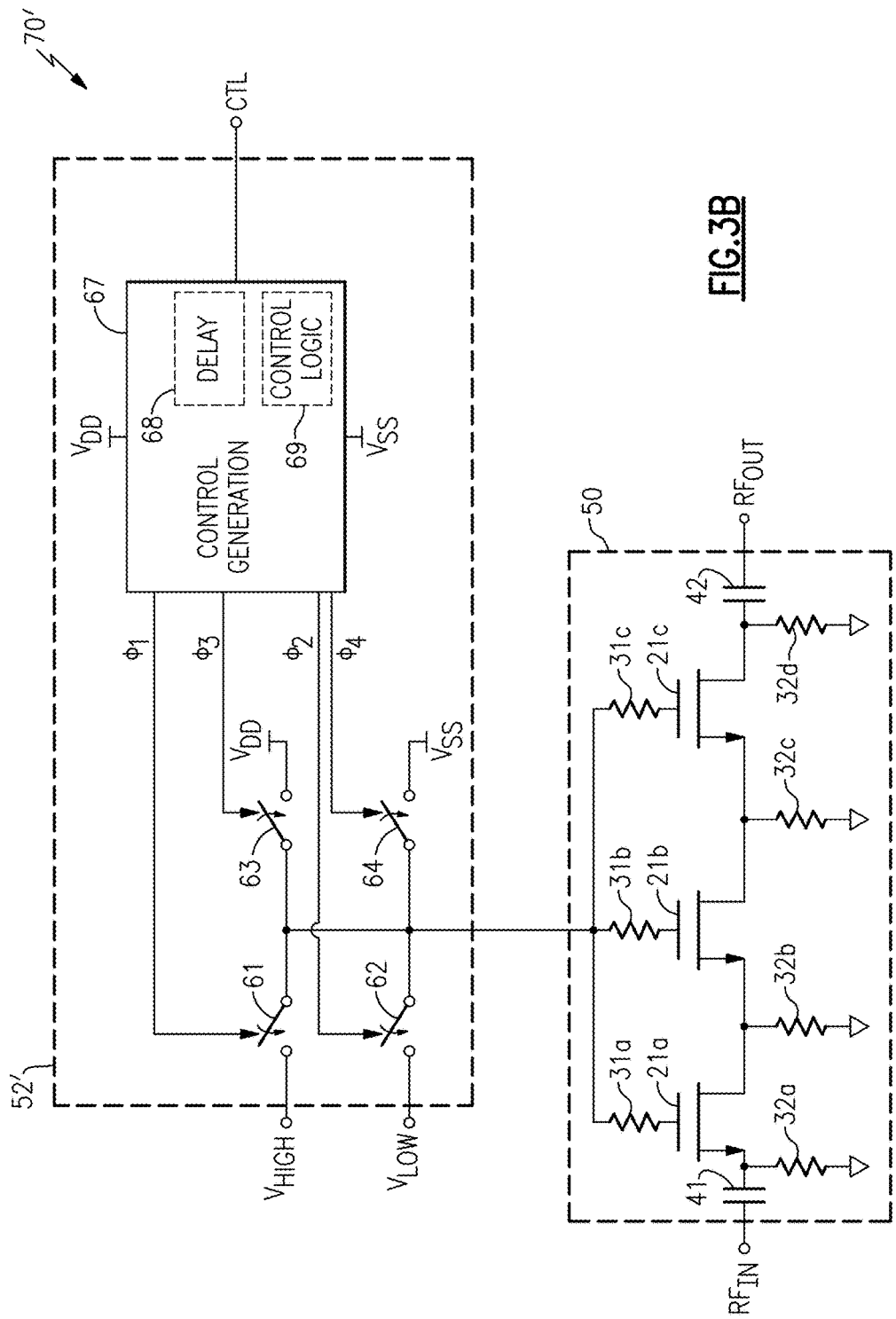
FIG. 3B is a circuit diagram of an RF switching circuit according to another embodiment.

FIG. 3B is a circuit diagram of an RF switching circuit 70' according to another embodiment. The RF switching circuit 70' of FIG. 3B is similar to the RF switching circuit 70 of FIG. 3A, except that the RF switching circuit 70' includes a switch bias circuit 52' having different connectivity for the third control switch 63 and for the fourth control switch 64.

In particular, in the embodiment shown in FIG. 3B, the third control switch 63 is connected between $V_{DD}$ and the output of the switch bias circuit 52', and the fourth control switch 64 is connected between $V_{SS}$ and the output of the switch bias circuit 52'.

Connecting the control switches 63 and 64 in this manner still allows the switch bias circuit 52' to pulse the switch control voltage to the appropriate voltage levels in response to a transition of the control signal CTL, and reduces a capacitive loading of the control signal CTL. However, the embodiment of FIG. 3A can provide superior transient performance by using the control signal CTL to provide initial charging or discharging of the output of the switch bias circuit 52 after the control signal CTL has transitioned but before the control generation circuit 67 changes a state of the control switches 61-64 in response to the transition.

Figure 4A:
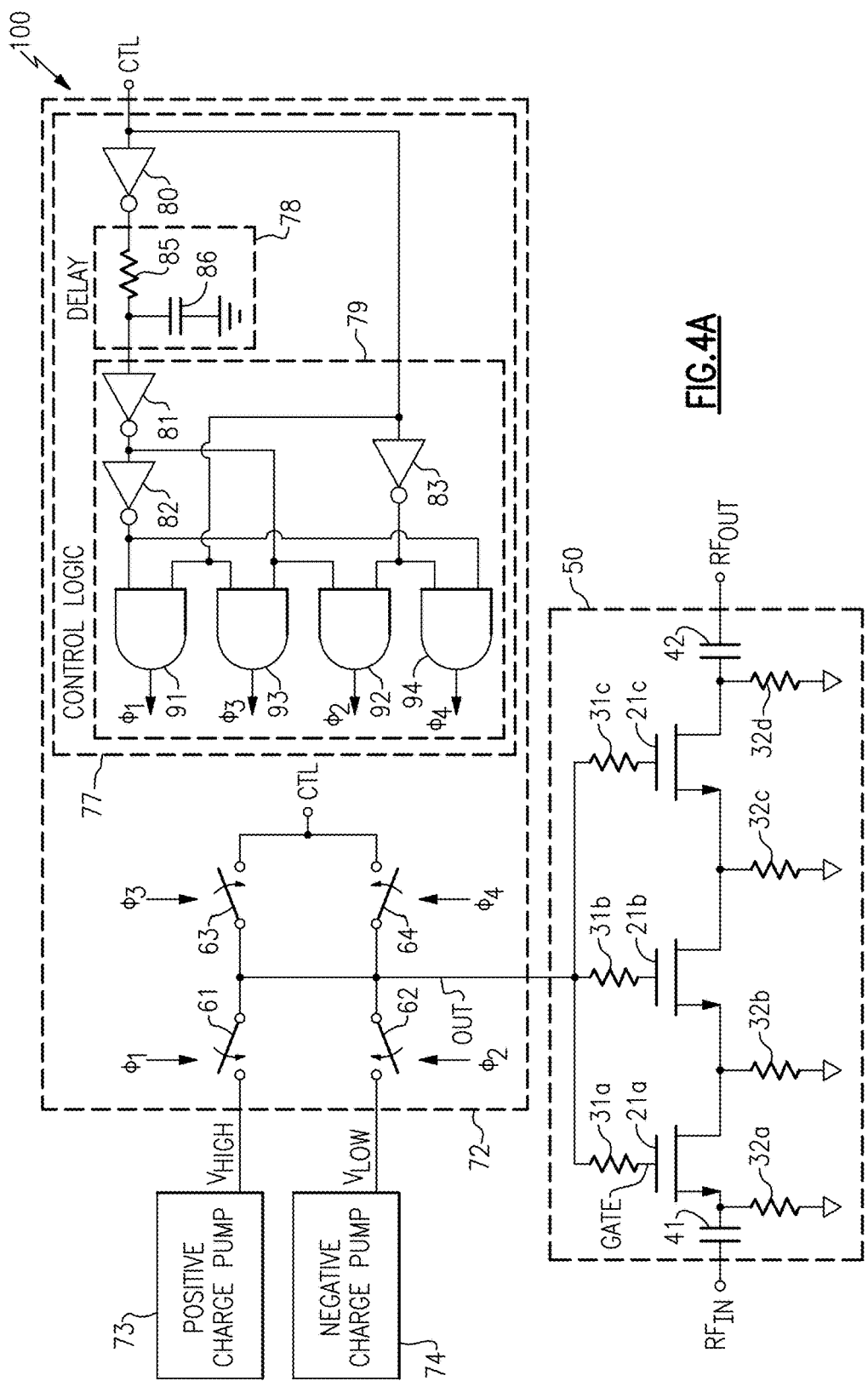
FIG. 4A is a circuit diagram of an RF switching circuit according to another embodiment.

FIG. 4A is a circuit diagram of an RF switching circuit 100 according to another embodiment. The RF switching circuit 100 includes an RF switch 50, a switch bias circuit 72, a positive charge pump 73, and a negative charge pump 74.

The RF switching circuit 100 of FIG. 4A is similar to the RF switching circuit 70 of FIG. 3A, except that the switch bias circuit 72 of FIG. 4A includes a specific implementation of the control generation circuit 67 of FIG. 3A. Furthermore, the RF switching circuit 100 of FIG. 4A also includes the positive charge pump 73 for generating the high voltage $V_{HIGH}$ and the negative charge pump 74 for generating the low voltage $V_{LOW}$.

With continuing reference to FIG. 4A, the control generation circuit 77 of FIG. 4A includes a delay circuit 78, control logic 79, and a control signal inverter 80. The delay circuit 78 includes a resistor 85 and a capacitor 86, which operate as a timer providing a delay based on a resistor-capacitor (RC) time constant of the resistor 85 and the capacitor 86. The control logic 79 includes a first inverter 81, a second inverter 82, a third inverter 83, a first AND gate 91, a second AND gate 92, a third AND gate 93, and a fourth AND gate 94. In certain implementations, the delay circuit 78 is implemented as an inverter or a chain of inverters.

Figure 4B:
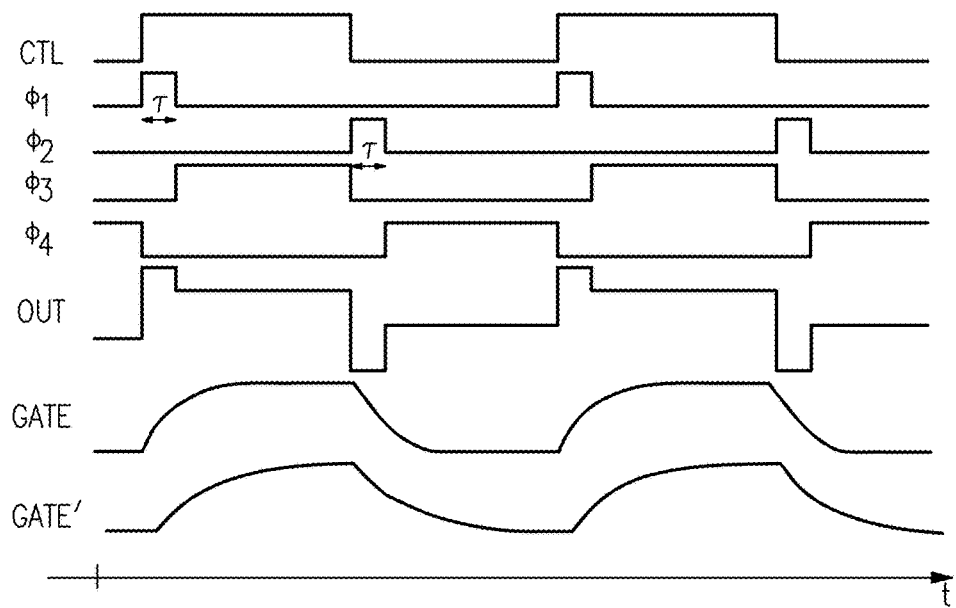
FIG. 4B is one example of a timing diagram for the RF switching circuit of FIG. 4A.

FIG. 4B is one example of a timing diagram for the RF switching circuit 100 of FIG. 4A. The timing diagram includes example voltage versus time waveforms for the control signal CTL, the first bias control signal $\varphi_1$, the second bias control signal $\varphi_2$, the third bias control signal $\varphi_3$, and the fourth bias control signal $\varphi_4$. The timing diagram also includes a voltage versus time waveform for the output node OUT, which corresponds to the output of the switch bias circuit 72 of FIG. 4A. The timing diagram also includes a voltage versus time waveform for gate node GATE, which corresponds to a gate voltage of the NFET switch 21a. The timing diagram also includes a voltage versus time waveform for gate node GATE', which corresponds to a gate voltage of the NFET switch 21a for an implementation in which the output of the switch bias circuit is not pulsed.

With reference to FIGS. 4A and 4B, the control logic 79 operates to turn on one of the four control switches 61-64 at any given time to thereby bias the output node OUT.

In response to a transition of the control signal CTL from low to high (corresponding to turning on the FET switch 50, in this embodiment), $\varphi_4$ is deactivated and $\varphi_1$ is activated to thereby control the output node OUT to $V_{HIGH}$ and charge the gate node GATE. The duration τ of the turn-on pulse at the output node OUT is determined by the RC time constant of the delay circuit 78 and a threshold voltage of the inverter 81. Following the delay of the pulse, $\varphi_1$ is deactivated and $\varphi_3$ is activated to control the output node OUT to the high level of the control signal CTL, which is $V_{DD}$ in certain implementations.

In response to a transition of the control signal CTL from high to low (corresponding to turning off the FET switch 50, in this embodiment), $\varphi_3$ is deactivated and $\varphi_2$ is activated to thereby control the output node OUT to $V_{LOW}$ and discharge the gate node GATE. The duration τ of the turn-off pulse at the output node OUT is determined by the RC time constant of the delay circuit 78 and a threshold voltage of the inverter 81. Following the delay of the pulse, $\varphi_2$ is deactivated and $\varphi_4$ is activated to control the output node OUT to the low level of the control signal CTL, which is $V_{SS}$ in certain implementations.

As shown by a comparison of GATE and GATE', pulsing the output of the switch bias circuit provides an improvement in turn on time and turn off time of the RF switch relative to an implementation in which the output is not pulsed.

Figure 5A:
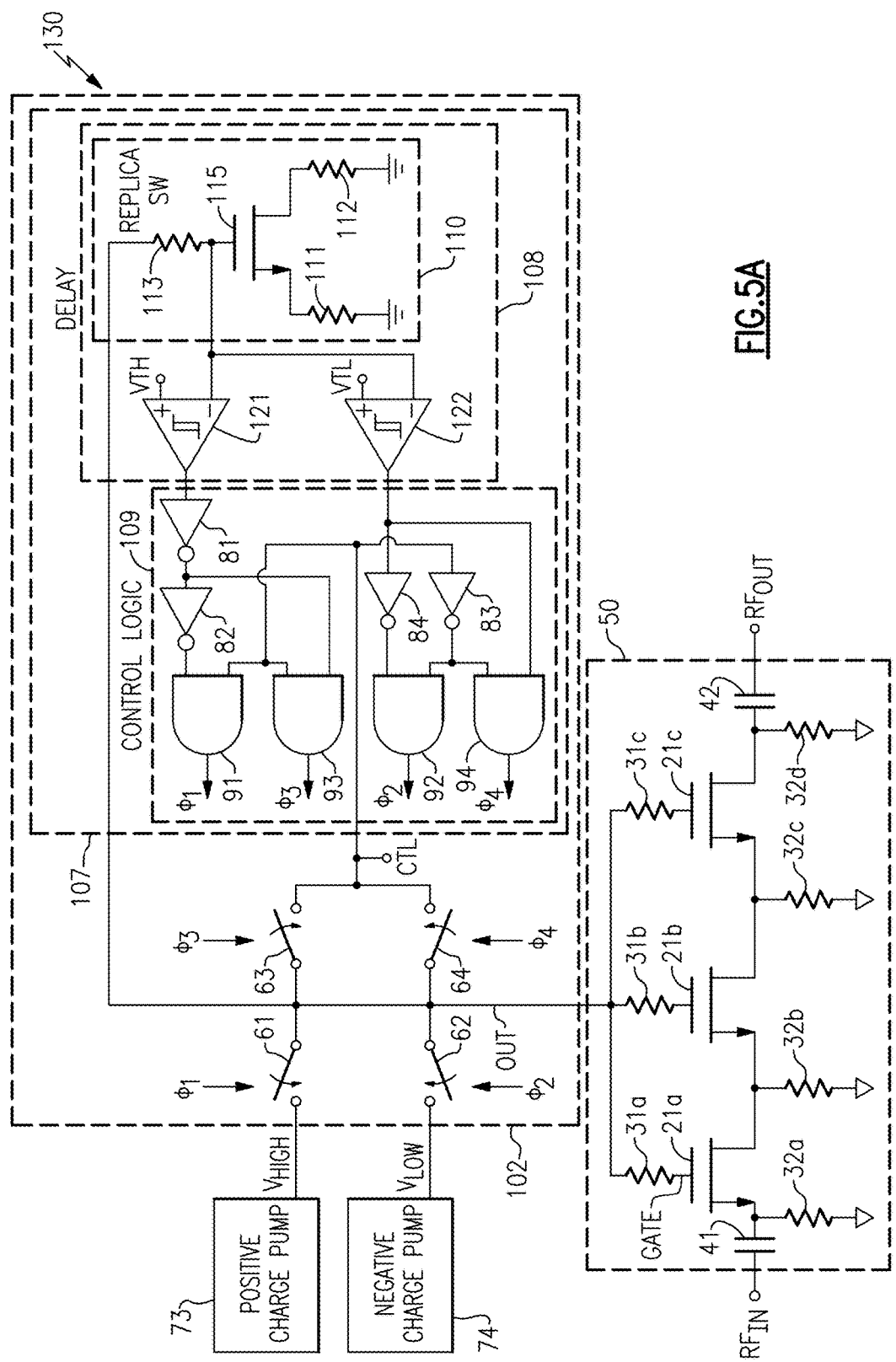
FIG. 5A is a circuit diagram of an RF switching circuit according to another embodiment.

FIG. 5A is a circuit diagram of an RF switching circuit 130 according to another embodiment. The RF switching circuit 130 includes an RF switch 50, a switch bias circuit 102, a positive charge pump 73, and a negative charge pump 74.

The RF switching circuit 130 of FIG. 5A is similar to the RF switching circuit 100 of FIG. 4A, except that the switch bias circuit 102 of FIG. 5A includes a different implementation of a control generation circuit 107 relative to the switch bias circuit 72 of FIG. 4A.

As shown in FIG. 5A, the control generation circuit 107 includes a delay circuit 108 and control logic 109. The delay circuit 108 includes a replica switch 110, a first comparator 121, and a second comparator 122. The replica switch 110 includes a replica gate resistor 113, a replica NFET switch 115, a first replica channel biasing resistor 111, and a second replica channel biasing resistor 112. The control logic 109 includes a first inverter 81, a second inverter 82, a third inverter 83, a fourth inverter 84, a first AND gate 91, a second AND gate 92, a third AND gate 93, and a fourth AND gate 94.

The illustrated embodiment uses closed loop control to determine a duration of the pulse of the gate control voltage generated by the switch bias circuit 130. In particular, the first comparator 121 compares a gate voltage of the replica NFET switch 115 to a high threshold VTH to control the turn-on pulse width (for example, duration 15 of FIG. 2B) of the gate control voltage in response to turning on the RF switch 50. Additionally, the second comparator 122 compares the gate voltage of the replica NFET switch 115 to a low threshold voltage VTL to control the turn-off pulse width (for example, duration 16 of FIG. 2B) of the gate control voltage in response to turning off the RF switch 50.

The feedback loop operates to monitor the gate voltage of the replica NFET switch 115 to thereby terminate the pulse voltage level and apply the steady-state voltage level. By using a replica FET switch, the voltage at the gate node is indirectly detected or estimated without loading the actual gate node of the RF switch 50, which leads to a degradation in switch performance, such as loss, lower cut off frequency, or degraded power handling.

Using closed loop control can provide enhanced performance relative to open loop control, which can have a fixed time delay selected to be less than the settling time of the RF switch to avoid controlling the gate voltage of RF switch's transistors to voltage levels that could exceed transistor reliability levels and cause transistor damage (for instance, gate oxide damage).

Although one implementation of a replica switch is shown, a replica switch can be implemented in a wide variety of ways. In certain configurations, a replica switch is scaled in size relative to the actual RF switch, for instance, smaller in size to reduce layout area of the switch bias circuit. Furthermore, a replica switch need not include a copy of each element of the RF switch, but rather a portion of the RF switch can be replicated.

Figure 5B:
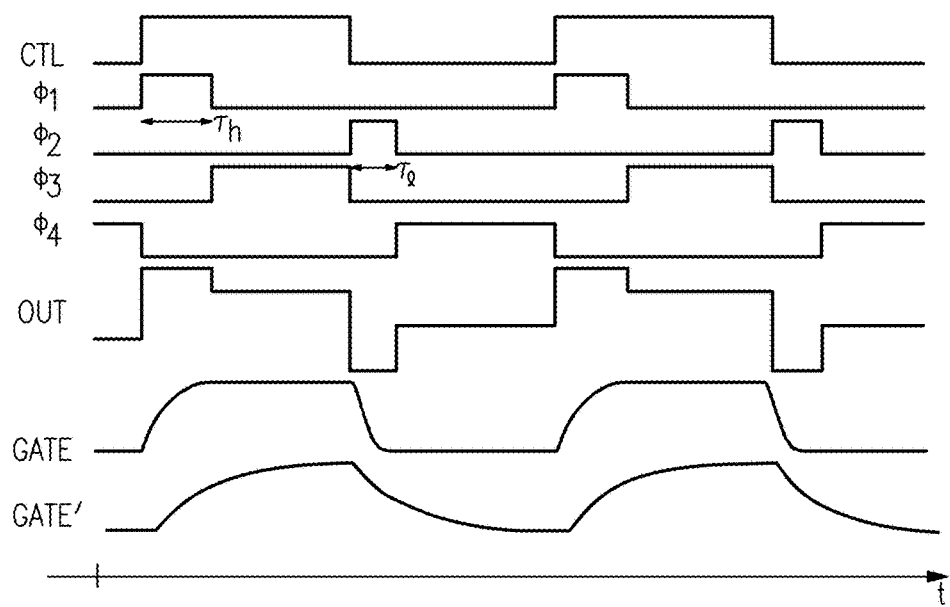
FIG. 5B is one example of a timing diagram for the RF switching circuit of FIG. 5A.

FIG. 5B is one example of a timing diagram for the RF switching circuit 150 of FIG. 5A. The timing diagram includes example voltage versus time waveforms for the control signal CTL, the first bias control signal $\varphi_1$, the second bias control signal $\varphi_2$, the third bias control signal $\varphi_3$, the fourth bias control signal $\varphi_4$, the output node OUT, the gate node GATE (the gate voltage of the NFET switch 21a), and the gate node GATE' (the gate voltage of the NFET switch 21a for an implementation in which the output of the switch bias circuit is not pulsed).

The timing diagram of FIG. 5B is similar to the timing diagram of FIG. 4B, except that the timing diagram includes closed-loop control to dynamically control a duration of the pulses of the output node OUT. In particular, when turning on the RF switch 50, a turn-on pulse width $\tau_h$ is dynamically controlled based on settling of the gate voltage of the replica switch 110. Additionally, when turning off the RF switch 50, a turn-off pulse width $\tau_1$ is dynamically controlled based on settling of the gate voltage of the replica switch 110.

As shown in FIG. 5B, the pulse width $\tau_h$ and pulse width $\tau_1$ need not be the same, but rather dynamically tracks the settling of the replica switch 110. Moreover, the pulse widths can change to track variation in process, voltage, and/or temperature, thereby enhancing performance by tailoring pulse duration to operating conditions and/or to compensate for manufacturing variation. As shown by a comparison of the waveform of the gate node GATE of FIG. 5B relative to the gate node GATE of FIG. 4B, closed loop control of the pulse widths achieves faster switching speed relative to open loop control of the pulse widths.

Figures 6A, 6B:
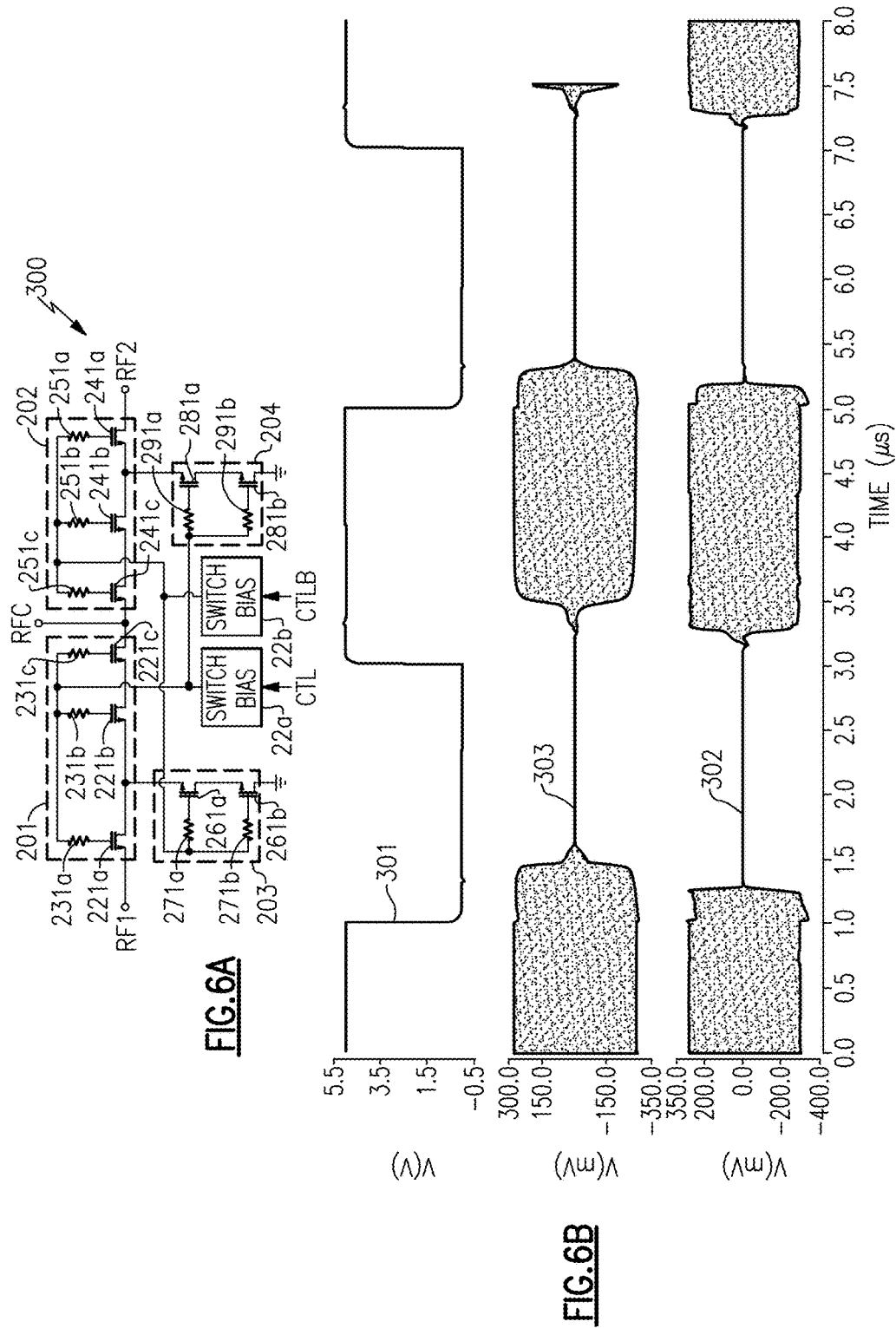
FIG. 6A is a circuit diagram of an RF switching circuit according to another embodiment.
FIG. 6B is one example of a timing diagram for the RF switching circuit of FIG. 6A.

FIG. 6A is a circuit diagram of an RF switching circuit 300 according to another embodiment. The RF switching circuit 300 includes a first switch bias circuit 22a, a second switch bias circuit 22b, a first series RF switch 201, a second series RF switch 202, a first shunt RF switch 203, and a second shunt RF switch 204.

As shown in FIG. 6A, the first series RF switch 201 includes NFET switch transistors 221a, 221b, 221c and gate resistors 231a, 231b, 231c. Additionally, the second series RF switch 202 includes NFET switch transistors 241a, 241b, 241c and gate resistors 251a, 251b, 251c. Furthermore, the first shunt RF switch 203 includes NFET switch transistors 261a, 261b and gate resistors 271a, 271b. Additionally, the second shunt RF switch 204 includes NFET switch transistors 281a, 281b and gate resistors 291a, 291b. For clarity of the figures, circuitry for biasing the source and drain regions of the transistors is not shown in FIG. 6A.

The RF switching circuit 300 illustrates one example of using pulsed switch biasing to enhance the switching speed of a multi-throw switch. For example, the RF switching circuit 300 illustrates one example of a single pole (RFC) and double throw (RF1/RF2) switch, which can serve as a band selection switch, a transmit/receive switch, or other suitable switch function.

Although one example of a single pole double throw (SPDT) switch is shown, the teachings herein are applicable to SPDT switches implemented in a wide variety of ways. Moreover, the teachings herein are applicable to RF switches including other numbers of poles and/or throws.

FIG. 6B is one example of a timing diagram for the RF switching circuit 300 of FIG. 6A. The timing diagram includes a voltage versus time waveform 301 of the control signal CTL and a voltage versus time waveform 302 of the terminal RF1 under a condition in which an RF signal is present at the terminal RFC. The timing diagram also depicts a voltage versus time waveform 303 of the terminal RF1 for an implementation without pulsing.

As shown by a comparison of the waveform 302 and the waveform 303, pulsing the gate control voltage of a FET switch enhances switching performance of the RF switch, including an improvement in turn on time and turn off time of the RF switch.

Although various simulation results have been provided above, simulation results can differ based on a wide variety of factors, such as circuit implementation, simulation models, simulation parameters, and/or simulation tools. Accordingly, other simulation results are possible.

Figure 7A:
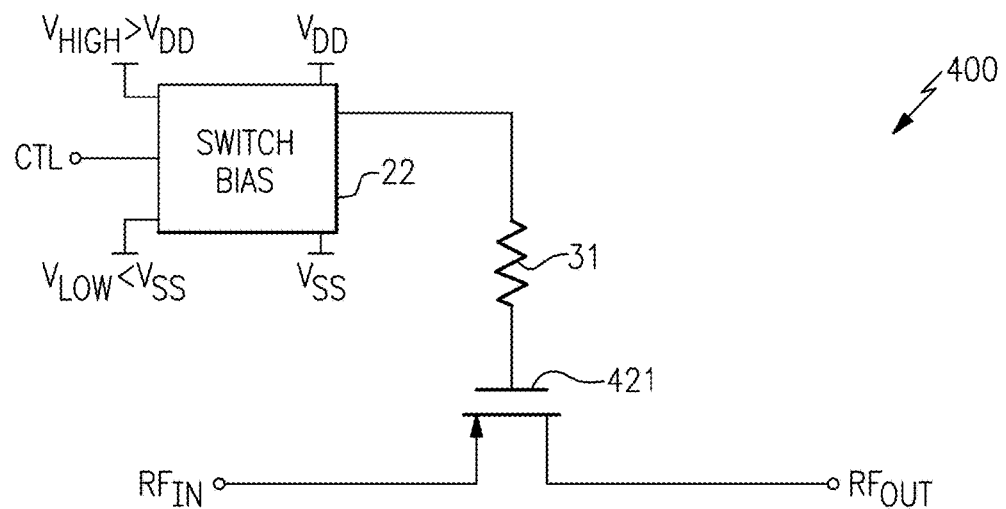
FIG. 7A is a circuit diagram of an RF switching circuit according to another embodiment.

FIG. 7A is a circuit diagram of an RF switching circuit 400 according to another embodiment. The RF switching circuit 400 includes a p-type field effect transistor (PFET) switch 421, a switch bias circuit 22, and a gate bias resistor 31. The RF switching circuit 400 of FIG. 7A is similar to the RF switching circuit 20 of FIG. 2A, except that the RF switching circuit 400 of FIG. 7A includes the PFET switch 421 rather than the NFET switch 21. In certain implementations, the PFET switch 421 is a p-type metal oxide semiconductor (PMOS) switch.

Figure 7B:
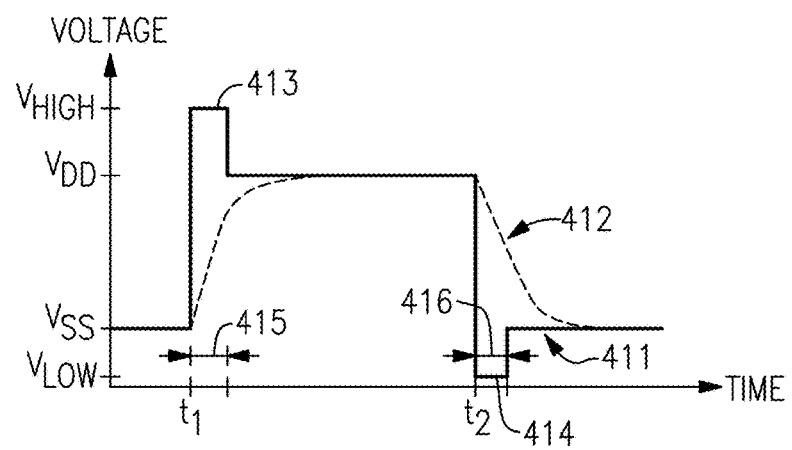
FIG. 7B is one example of a timing diagram for the RF switching circuit of FIG. 7A.

FIG. 7B is one example of a timing diagram for the RF switching circuit 400 of FIG. 7A. The timing diagram includes a first plot 411 of switch control voltage outputted by the switch bias circuit 22 versus time, and a second plot 412 of gate voltage of the PFET switch 421 versus time. The timing diagram includes a first time $t_1$ at which the control signal CTL transitions to turn the PFET switch 421 from an ON state to an OFF state, and a second time $t_2$ at which the control signal CTL transitions to turn the PFET switch 421 from the OFF state to the ON state.

As shown in FIG. 7B, the switch bias circuit 22 pulses the switch control voltage when turning off the switch as well as when turning on the switch, in this embodiment. For example, when the PFET switch 421 is turned off at time $t_1$, the switch bias circuit 22 generates a turn-off pulse 413 associated with first transitioning the switch control voltage from $V_{SS}$ to $V_{HIGH}$, and thereafter from $V_{HIGH}$ to $V_{DD}$. Additionally, when the PFET switch 421 is turned on at time $t_2$, the switch bias circuit 22 generates a turn-on pulse 414 associated with first transitioning the switch control voltage from $V_{DD}$ to $V_{LOW}$, and thereafter from $V_{LOW}$ to $V_{SS}$.

Although one example of an RF switching circuit with a PFET switch is shown in FIGS. 7A-7B, any of the RF switching circuits herein can be implemented with PFET switches.

APPLICATIONS

Devices employing the above described schemes can be implemented into various electronic devices. Examples of electronic devices include, but are not limited to, RF communication systems, consumer electronic products, electronic test equipment, communication infrastructure, etc. For instance, RF switches with fast switching can be used in a wide range of RF communication systems, including, but not limited to, base stations, mobile devices (for instance, smartphones or handsets), laptop computers, tablets, Internet of Things (IoT) devices, and/or wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) system with a short switching delay and a fast switching speed, the RF system comprising:
    an RF switch including a control input that controls an impedance of the RF switch;
    a switch bias circuit configured to receive a control signal for selectively controlling a state of the RF switch, the switch bias circuit including:
        a delay circuit configured to time a delay duration in response to a transition of the control signal; and
        a logic circuit configured to select a switch control voltage based on the control signal and configured to change the selection of the switch control voltage after the delay duration; and
    a resistor electrically connected between an output of the switch bias circuit and the control input to the RF switch,
    wherein the switch bias circuit is configured to generate a first pulse in the switch control voltage in response to the transition of the control signal.

2. The RF system of claim 1, wherein the switch bias circuit is configured to generate the first pulse by controlling the switch control voltage to a first voltage level for the delay duration of the first pulse when transitioning to a steady state and thereafter to a second voltage level when transitioned to the steady state.

3. The RF system of claim 2, wherein the switch bias circuit comprises a resistor-capacitor network.

4. The RF system of claim 2, wherein the switch bias circuit comprises a replica of at least a portion of the RF switch, wherein the switch bias circuit is further configured to control the delay duration of the first pulse by monitoring a signal condition of the replica.

5. The RF system of claim 2, wherein the first voltage level exceeds a breakdown voltage of the RF switch without damaging the RF switch.

6. The RF system of claim 1, wherein the RF switch is a metal oxide semiconductor (MOS) switch.

7. The RF system of claim 1, wherein the switch bias circuit is configured to generate the first pulse of the switch control voltage at a first voltage level in response to a first transition of the control signal indicating a turn-on of the RF switch, and to generate a second pulse of the switch control voltage at a second voltage level in response to a second transition of the control signal indicating a turn-off of the RF switch, wherein the first pulse and the second pulse have opposite polarity, wherein the first voltage level exceeds a steady on-state voltage of the switch control voltage, and wherein the second voltage is below a steady off-state voltage of the switch control voltage.

8. A method of switch control to shorten a delay in switching a radio frequency (RF) switch to provide faster switching speed, the method comprising:
    controlling an impedance of a radio frequency (RF) switch using a switch control voltage from a switch bias circuit, including providing the switch control voltage from an output of the switch bias circuit to a control input of the RF switch through a resistor;
    providing a control signal to a control logic circuit and to a delay circuit that is configured to time a delay duration, the control signal indicating whether to turn on or turn off the RF switch;
    generating a pulse of the switch control voltage for the delay duration in response to a transition of the control signal; and
    changing the switch control voltage after the delay duration while the control signal is provided to the control logic circuit.

9. The method of claim 8 further comprising controlling a duration of the pulse based on monitoring a signal condition of a replica of at least a portion of the RF switch.

10. The method of claim 8 further comprising controlling a voltage level of the pulse using a charge pump voltage.

11. The method of claim 8 further comprising providing the switch control voltage to the control input of the RF switch via an impedance, and controlling a voltage level of the pulse beyond a breakdown voltage of the RF switch.

12. A radio frequency (RF) switching circuit comprising:
    a field-effect transistor (FET) switch including a gate;
    a switch bias circuit configured to receive a control signal and to output a switch control voltage; and
    a resistor configured to provide the switch control voltage to the gate of the FET switch,
    wherein the switch bias circuit is configured to generate a turn-on pulse of the switch control voltage in response to a transition of the control signal from an off state to an on state and to generate a turn-off pulse of the switch control voltage in response to a transition of the control signal from the on state to the off state, the switch bias circuit comprising:
        a delay circuit configured to time a delay duration when the control signal transitions; and
        a logic circuit configured to change the switch control voltage in response to a change in the control signal and configured to change the switch control voltage after the delay duration after the change in the control signal.

13. The RF switching circuit of claim 12, wherein the delay circuit comprises a timer configured to control at least one of a duration of the turn-on pulse or a duration of the turn-off pulse.

14. The RF switching circuit of claim 12, wherein the switch bias circuit comprises a replica of at least a portion of the FET switch, wherein the replica controls at least one of a duration of the turn-on pulse or a duration of the turn-off pulse.

15. The RF switching circuit of claim 12, wherein the FET switch is an n-type metal oxide semiconductor (NMOS) switch or a p-type metal oxide semiconductor (PMOS) switch.

16. The RF switching circuit of claim 12, wherein the switch bias circuit is configured to:
   generate the turn-on pulse in response to the transition of the control signal from the off state to the on state by controlling the switch control voltage to a first pulse voltage level for a duration of the turn-on pulse and by thereafter controlling the switch control voltage to a steady-state on voltage for a remaining duration of the on state of the control signal; and
   generate the turn-off pulse in response to a transition of the control signal from the on state to the off state by controlling the switch control voltage to a second pulse voltage level for a duration of the turn-off pulse and by thereafter controlling the switch control voltage to a steady-state off voltage for a remaining duration of the off state of the control signal.

17. The RF switching circuit of claim 16, further comprising a first charge pump configured to generate the first pulse voltage level, and a second charge pump configured to generate the second pulse voltage level.

18. The RF switching circuit of claim 16, wherein at least one of the first pulse voltage level or the second pulse voltage level is beyond a breakdown voltage of the FET switch.

19. The RF switching circuit of claim 16, wherein the switch bias circuit comprises a first control switch configured to selectively control the switch control voltage to the first pulse voltage level, a second control switch configured to selectively control the switch control voltage to the second pulse voltage level, and a third control switch and a fourth control switch configured to selectively control the switch control voltage with the control signal.

20. The RF system of claim 1, wherein the logic circuit is configured to select the switch control voltage from among a plurality of voltages including:
   a high power supply voltage;
   a ground or low power supply voltage;
   a high voltage output by a positive charge pump, the high voltage exceeding the high power supply voltage; and
   a low voltage output by a negative charge pump, the low voltage being less than the ground or low power supply voltage.

21. The RF system of claim 1, wherein the control input controls the impedance of the RF switch at a gate of the RF switch.

22. The RF system of claim 1, wherein the control input controls the impedance of the RF switch by controlling a gate-to-source voltage of the RF switch.

23. The RF system of claim 1, wherein the logic circuit is configured to select the switch control voltage based on the control signal and configured to control at least:
   a first control switch configured to couple the switch control voltage to a positive charge pump;
   a second control switch configured to couple the switch control voltage to a turn- on steady state voltage;
   a third control switch configured to couple the switch control voltage to a negative charge pump; and
   a fourth switch configured to couple the switch control voltage to a turn-off steady state voltage.

24. The RF system of claim 1, wherein the logic circuit comprises:
   a first AND gate configured to control a first control switch;
   a second AND gate configured to control a second control switch;
   a first inverter configured to invert a delay signal from the delay circuit to provide an inverted delay signal to the second AND gate; and
   a second inverter configured provide an inversion of the inverted delay signal to the first AND gate.

25. The RF system of claim 4, wherein the switch bias circuit comprises a replica of at least a portion of the RF switch, wherein the switch bias circuit is further configured to control the delay duration of the pulse by monitoring a signal condition of the replica using a comparator.

26. The RF system of claim 1, wherein the control input is provided through a plurality of respective resistors to a plurality of respective RF switches, the plurality of RF switches being coupled in series to each other.

27. The method claim 8, wherein controlling the impedance of the RF switch includes providing the switch control voltage from an output of the switch bias circuit to a gate of the RF switch.

28. The method claim 8, wherein controlling the impedance of the RF switch includes using the switch control voltage to control a gate-to-source voltage of the RF switch.

29. The method claim 8, wherein providing the switch control voltage from an output of the switch bias circuit to the control input of the RF switch through the resistor includes sequentially closing each control switch of at least two control switches to sequentially provide different voltage levels for the switch control voltage.

30. The method of claim 9, wherein monitoring a signal condition of a replica of at least a portion of the RF switch includes comparing a threshold voltage to a gate voltage of the replica.

31. The RF switching circuit of claim 12, wherein the switch bias circuit comprises:
   a first control switch configured to provide the turn-on pulse from a positive charge pump in response to the transition of the control signal from an off state to an on state;
   a second control switch configured to provide a steady state on voltage during the on state;
   a third control switch configured to generate the turn-off pulse from a negative charge pump in response to the transition of the control signal from an on state to an off state; and
   a fourth control switch configured to provide a steady state off voltage during the off state.

32. The RF switching circuit of claim 12, wherein the logic circuit includes:
   a first AND gate configured to control a first control switch;
   a second AND gate configured to control a second control switch;
   a third AND gate configured to control a third control switch;
   a fourth AND gate configured to control a fourth control switch;

a first inverter coupled to the first AND gate;
a second inverter coupled to the first inverter and to the second AND gate; and
a third inverter coupled to the third AND gate and to the fourth AND gate.

33. The RF switching circuit of claim 14, wherein the replica controls the duration of the turn-on pulse based at least in part on a first comparator output from a first comparator and a second comparator output from a second comparator.

34. The RF switching circuit of claim 12, wherein the control input is provided through a plurality of respective resistors to a plurality of respective FETs, the plurality of FETs being coupled in series to each other.

* * * * *